(12) United States Patent
Hou et al.

(10) Patent No.: US 9,543,545 B2
(45) Date of Patent: Jan. 10, 2017

(54) DISPLAY SUBSTRATE WITH BRAGG REFLECTION UNIT FOR EACH OF THE DISPLAY UNITS OF AT LEAST THREE PRIMARY COLORS

(71) Applicant: BOE TECHNOLOGY GROUP CO., LTD., Beijing (CN)

(72) Inventors: Wenjun Hou, Beijing (CN); Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/415,628

(22) PCT Filed: May 27, 2014

(86) PCT No.: PCT/CN2014/078504
§ 371 (c)(1),
(2) Date: Jan. 19, 2015

(87) PCT Pub. No.: WO2015/096380
PCT Pub. Date: Jul. 2, 2015

(65) Prior Publication Data
US 2015/0188086 A1 Jul. 2, 2015

(30) Foreign Application Priority Data
Dec. 25, 2013 (CN) .......................... 2013 1 0729311

(51) Int. Cl.
*H01L 51/52* (2006.01)
*G02B 5/28* (2006.01)
(Continued)

(52) U.S. Cl.
CPC .......... *H01L 51/5265* (2013.01); *G02B 5/285* (2013.01); *H01L 27/3211* (2013.01); *H01L 51/5271* (2013.01); *H01L 51/56* (2013.01)

(58) Field of Classification Search
None
See application file for complete search history.

(56) References Cited

U.S. PATENT DOCUMENTS 6,618,107 B1* 9/2003 Tanaka .............. G02F 1/133514
349/106
7,932,533 B2* 4/2011 Wang .................. H01L 51/5265
257/294
(Continued)

FOREIGN PATENT DOCUMENTS

CN 1333924 A 1/2002
CN 102124405 A 7/2011
(Continued)

OTHER PUBLICATIONS

Chinese Office Action dated May 26, 2015 issued in Chinese Patent Application No. 201310729311.7.
(Continued)

*Primary Examiner* — Michael Jung
(74) *Attorney, Agent, or Firm* — Nath, Goldberg & Meyer; Joshua B. Goldberg; Christopher Thomas

(57) ABSTRACT

The present invention relates to the technical field of display, and provides a display substrate and a preparing method thereof which can solve the problem of lower light-emitting efficiency of the display substrate in the prior art. The display substrate of the present invention comprises a plurality of display units of at least two different colors. The display substrate further comprises a plurality of bragg reflection units in different regions corresponding to respective display units, each bragg reflection unit comprises first structural layer and second structural layer which are alternately stacked with each other and have different refractive indexes; thickness of each of the first and second structural layers is ¼n wavelength of incident light from corresponding display unit, wherein n is refractive index of the first or (Continued)

the second structural layer. The display substrate of the present invention has higher light-emitting efficiency and is applicable to full-color display.

17 Claims, 2 Drawing Sheets

(51) Int. Cl.
*H01L 27/32* (2006.01)
*H01L 51/56* (2006.01)

(56) References Cited

U.S. PATENT DOCUMENTS

| 2006/0181204 | A1 | 8/2006 | Zhu et al. |
| 2007/0091599 | A1 | 4/2007 | Hsieh et al. |
| 2010/0053043 | A1* | 3/2010 | Sakamoto ............ H01L 27/3213 345/77 |
| 2010/0230702 | A1* | 9/2010 | Park ........................ H01L 33/46 257/98 |
| 2012/0242565 | A1* | 9/2012 | Noh ........................ G02F 1/167 345/107 |
| 2013/0146878 | A1 | 6/2013 | Oh et al. |
| 2014/0151575 | A1* | 6/2014 | Hillmer .................. B82Y 10/00 250/458.1 |
| 2014/0354367 | A1* | 12/2014 | Suzuki .................. B82Y 20/00 331/94.1 |

FOREIGN PATENT DOCUMENTS

| CN | 102460232 A | 5/2012 |
| CN | 103235356 A | 8/2013 |
| CN | 103728683 A | 4/2014 |
| EP | 1 312 972 A1 | 5/2003 |

OTHER PUBLICATIONS

Written Opinion of the International Searching Authority dated Sep. 30, 2014 issued in International Application No. PCT/CN2014/078504.

International Application No. PCT/CN2014/078504, International Search Report dated Sep. 30, 2014, thirteen (13) pages.

* cited by examiner

DISPLAY SUBSTRATE WITH BRAGG REFLECTION UNIT FOR EACH OF THE DISPLAY UNITS OF AT LEAST THREE PRIMARY COLORS

This is a National Phase Application filed under 35 U.S.C. 371 as a national stage of PCT/CN2014/078504, filed May 27, 2014, an application claiming benefit from Chinese Patent Application No. 201310729311.7 filed on Dec. 25, 2013, the content of each of which is hereby incorporated by reference in its entirety.

FIELD OF THE INVENTION

The present invention relates to the technical field of display, and particularly to a display substrate and a preparing method thereof.

BACKGROUND OF THE INVENTION

Bragg reflection structure (i.e. Distributed Bragg Reflector, DBR) is formed generally by alternately stacking high-refractive index material layers and low-refractive index material layers. It is required that the material should not absorb visible light. A DBR for improving light-emitting efficiency of semiconductor microcavity light-emitting diode is described in Chinese Paten Application CN 101478025A.

In the technical field of display, liquid crystal display dependent on normal light-emitting diode (LED) backlight has been used widely. In addition, Organic Light-Emitting Diode (OLED) device is paid more and more attention due to its advantages of uniform luminance, flicker free, sufficient safeness for environment, and so on. However, both of normal LED and OLED have lower light-emitting efficiency. For example, owing to influences of absorption, loss, interface scattering and reflection, light-emitting efficiency of OLED is only about 20%. Thus, it is an important research subject in the display technical field to improve light-emitting efficiency.

SUMMARY OF THE INVENTION

An object of the invention is to solve the problem that the display substrate in the prior art has low light-emitting efficiency, and provides a display substrate which has a high light-emitting efficiency and can achieve a full-color display, and a preparing method thereof.

The solution of the invention for solving the above problem is a display substrate, comprising a plurality of display units of at least two different colors, wherein, the display substrate further comprises a plurality of bragg reflection units located in different regions corresponding to respective display units, each bragg reflection unit comprises a first structural layer and a second structural layer which are alternately stacked with each other and have different refractive indexes; thickness of the first structural layer is $1/4n_1$ of wavelength of incident light from corresponding display unit, wherein $n_1$ is refractive index of the first structural layer; and thickness of the second structural layer is $1/4n_2$ of wavelength of incident light from corresponding display unit, wherein $n_2$ is refractive index of the second structural layer.

The display substrate of the invention has the Bragg reflection units in which the thicknesses of the first and second structural layers have the above characteristics, thus can improve the light-emitting efficiency of incident light and achieve a full-color display.

Preferably, the refractive index of the first structural layer is smaller than that of the second structural layer, and the incident light enters into the bragg reflection unit from the second structure layer.

Preferably, each bragg, reflection unit comprises at least two first structural layers and two second structural layers.

Preferably, material of the first structural layer is $SiO_2$.

Preferably, material of the second structural layer is $SiN_x$ or $TiO_2$.

Preferably, the display units include three types of display units, each type of which has a color selected from three primary colors.

More preferably, the three primary colors are red, green and blue,

Preferably, the display units each comprise an organic light-emitting device emitting corresponding color light, and the bragg reflection units are disposed nearer to light-emitting side of the display substrate than the organic light-emitting devices.

Preferably, the display units each comprise a color filter of corresponding color, and the bragg reflection units are disposed nearer to light-emitting side of the display substrate than the color filters.

Another object of the invention is to provide a preparing method of display substrate which has a high light-emitting efficiency and can achieve a full-color display the method comprising following steps of:

1) forming a first structural layer, wherein
depositing a first material layer on a substrate, and forming a plurality of patterns of first structural layer n different regions by patterning process, wherein thickness of each of the patterns of first structural layer in a respective region is $1/4n_1$ of wavelength of incident light from a display unit corresponding to this region, wherein $n_1$ is refractive index of the first structural layer;

2) forming a second structural layer, wherein
depositing a second material layer on the first structural layer, and forming a plurality of patterns of second structural layer located in the different regions by patterning process, wherein thickness of each of the patterns of second structural layer in a respective reunion as $1/4n_2$ of wavelength of incident light horn a display unit corresponding to this region, wherein is refractive index of the second structural layer; and 3) repeating the steps 1) and 2).

Preferably, the step of forming the patterns of first structural layer by patterning process comprises:

forming photoresist which has different thicknesses at positions in the different. regions on the first material layer respectively and performing plasma etching on the first material layer with photoresist formed. thereon so as to form a plurality of the patterns of first structural layer in the different regions such that the thickness of each of the patterns of first structural layers is $1/4n_1$ of wavelength of incident light from a display unit corresponding to the region in which this pattern of first structural layer is located, wherein $n_1$ is refractive index of the first structural layer.

Preferably, the step of forming the patterns of second structural layer by patterning process comprises:

forming photoresist which has different thicknesses at positions in the different regions on the second material layer respectively; and performing plasma etching on the second material layer with photoresist formed thereon so as to form a plurality of the patterns of second structural layer in the different regions such that the thickness of each of the patterns of second structural layer is $\frac{1}{4}n_2$ of wavelength of incident light from a display unit corresponding to the region in which this patterns of second structural layer is located, wherein $n_2$ is refractive index of the second structural layer.

The present invention provides a display substrate and a preparing method thereof. The display substrate of the present invention comprises a plurality of display units of at least two different colors. The display substrate further comprises a plurality of bragg reflection units in different regions corresponding to respective display units, each bragg reflection unit comprises a first structural layer and a second structural layer which are alternately stacked with each other and have different refractive indexes; thickness of each of the first and second structural layers is $\frac{1}{4}n$ of wavelength of incident light from corresponding display unit, wherein n is refractive index of the first or the second structural layer. The display substrate of the present invention has a higher light-emitting efficiency and is applicable to a full-color display.

Figure 1:
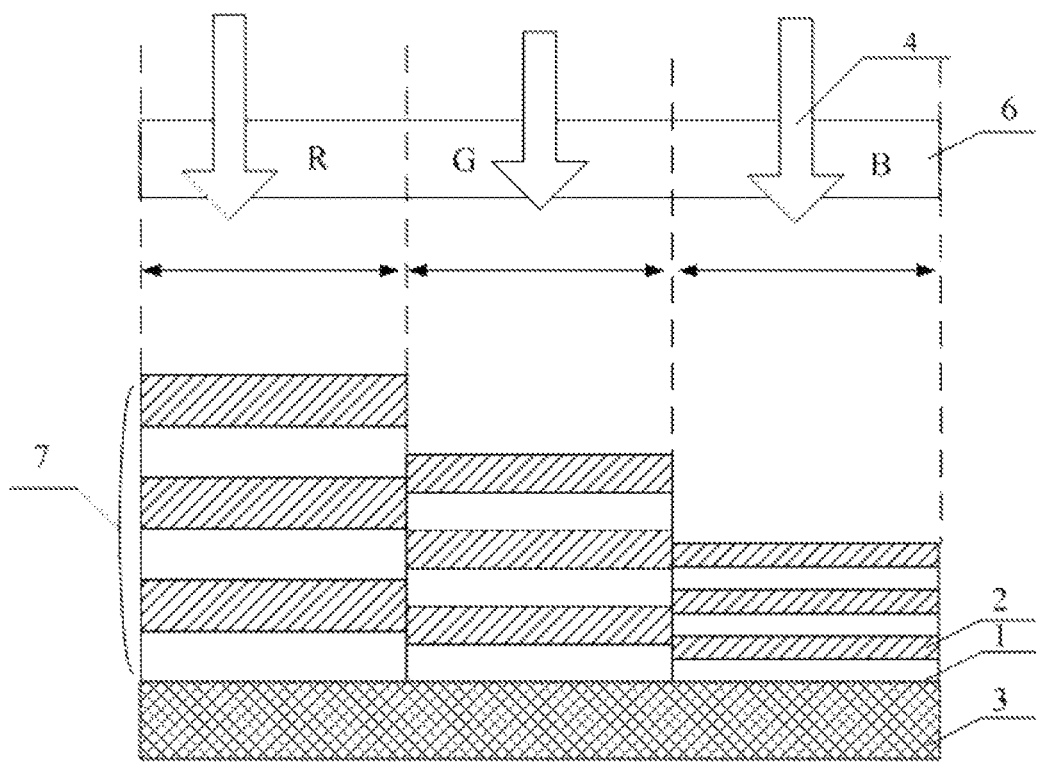
FIG. 1 schematic diagram showing a cross section of display substrate in an embodiment of the invention.

Reference Numerals:
1. first structural layer; 2. second structural layer; 3. substrate; 4. incident light; 5. photoresist 6. display unit; 7. bragg reflection unit.

DETAILED DESCRIPTION OF THE EMBODIMENTS

The present invention will be further described in detail below with reference to the accompanying drawings and specific embodiments in order that a skilled person in the art can understand the solution of the invention better.

As shown in FIG. 1, the present embodiment provides a display substrate which comprises a plurality of display units 6 of at least two different colors. The display substrate further comprises a plurality of bragg reflection units 7 which are located in different regions corresponding to respective display units 6. Each bragg reflection unit 7 comprises a first structural layer 1 and a second structural layer 2 which are alternately stacked with each other and have different refractive indexes. Thickness of the first structural layer 1 is $\frac{1}{4}n_1$ of wavelength of incident light from a display unit corresponding to the region in which this first structural layer 1 is located, wherein $n_1$ is refractive index of the first structural layer 1; and thickness of the second structural layer 2 is $\frac{1}{4}n_2$ of wavelength of incident light from a display unit corresponding to the region in which this second structural layer 2 is located, wherein $n_2$ is refractive index of the second structural layer 2 When preparing such display substrate, the bragg reflection units 7 are aligned with the substrate on which the display units 6 are disposed so as to form a cell.

Preferably, in each bragg reflection unit 7, the refractive index of the first structural layer 1 is smaller than that of the second structural layer 2, in which the incident light enters into the bragg reflection unit 7 from the second structure layer 2. That is, in the direction of the incident light, the second structural layer 2 is the outermost layer, which is nearest to the incident light side, in each bragg reflection unit 7.

Preferably, each bragg reflection unit 7 comprises at least two first structural layers 1 and two second structural layers 2. In the example as shown in FIG. 1, there are three first structural layers 1 and three second structural layers 2 alternately stacked. Each bragg reflection unit 7 may be constructed by alternately stacking more first structural layers 1 and more second structural layers 2, which can obtain a higher luminance of emitting light.

Preferably, material of the first structural layer 1 is $SiO_2$.

Preferably, material of the second structural layer 2 is $SiN_x$ or $TiO_2$.

Preferably, the display units 6 include three types of display units, each type of which has a color selected from three primary colors. The three primary colors are red, green and blue.

Preferably, the different regions correspond to the display units 6 in one-to-one manner.

Preferably, the display substrate may be a liquid crystal display substrate, and display units 6 comprise color filters with corresponding colors respectively. Preferably, the color filters are three-primary-color filters for full-color display, and more preferably, are red (R), green (CO and blue (B) color filters. Obviously, other type of three primary colors may be used. The bragg reflection units 7 are disposed nearer to light-emitting side of the display substrate than the color filters. That is, light emitting from R, G, and B color filters passes through the bragg reflection units 7 corresponding respectively to R, G, and B color filters and emits out. Emitting light having passed through the bragg reflection units 7 has advantages of concentrative direction, enhanced luminance, improved efficiency gain, and reduced light loss.

Preferably, the display substrate may be an organic light-Emitting display substrate, and the display units 6 may be the organic light-Emitting devices that emit corresponding color light. Preferably, the organic light-Emitting devices emit light of three primary colors for full-color display. More preferably, three primary colors are red (R), green (G) and blue (B). Obviously, other type of three primary colors may be used. The bragg reflection wins 7 are disposed nearer to light-emitting side of the display substrate than the organic light-Emitting devices. That is, light emitting from the organic light-Emitting devices passes through the bragg reflection units corresponding respectively to R, G, and B organic light-Emitting devices and emits out. Emitting light having passed through the bragg reflection units has advantages of concentrative direction, enhanced luminance, improved efficiency gain, and reduced light loss.

The present invention further provides a preparing method of the above display substrate comprising following steps of:

1) forming a first structural layer, wherein
depositing a first material layer on a substrate, and forming a plurality of patterns of first structural layer in different regions by patterning process, wherein thickness of each of the patterns of first structural layer in a respective region is $1/4n_1$ of wavelength of incident light from a display unit corresponding to this region, wherein $n_1$ is refractive index of the first structural layer;

2) forming a second structural layer, wherein depositing a second material layer on the first structural layer, and forming a plurality of patterns of second structural layer in the different regions by patterning process, wherein thickness of each of the patterns of second structural layer in a respective region is $1/4n_2$ of wavelength of incident light from a display unit corresponding to this region, wherein $n_2$ is refractive index of the second structural layer; and 3) repeating the steps and 2).

Preferably, the step of forming the patterns of first structural layer by patterning process comprises:

forming photoresist which has different thicknesses at positions in the different regions on the first material layer respectively; and performing plasma etching on the first material layer with photoresist formed thereon so as to form a plurality of the patterns of first structural layer in the different regions such that the thickness of each of the patterns of first structural layer is $1/4n_1$ of wavelength of incident light from a display unit corresponding to the region in which this first structural layer is located, wherein in is refractive index of the first structural layer.

Preferably, the step of forming the patterns of second structural layer by patterning process comprises:

forming photoresist which has different thicknesses at positions in the different regions on the second material layer respectively; and performing plasma etching on the second material layer with photoresist formed thereon so as to form a plurality of the patterns of second structural layer in the different regions such that the thickness of each of the patterns of second structural layer is $1/4n_2$ of wavelength of incident light from a display unit corresponding to the region in which this second structural layer is located, wherein $n_2$ is refractive index. of the second structural layer.

The foregoing preparing method of display substrate will be described below in conjunction with a specific application example.

Figure 2:
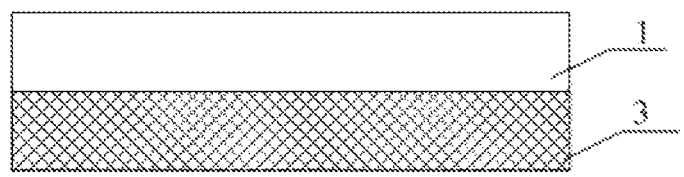
FIG. 2 is a schematic diagram showing a cross section after silicon dioxide has been applied, in preparing process of the display substrate in the embodiment of the invention.

The foregoing preparing method of display substrate may comprise following steps of:

1) Forming a First Structural Layer 1.1 Depositing a Layer of Material with Low Refractive Index As shown in FIG. 2, the material with low refractive index of the first structural layer 1 in the present embodiment is $SiO_2$. A $SiO_2$ layer is deposited on a substrate 3, thickness of the $SiO_2$ layer being $1/4n_{SiO2}$ of wavelength of red light, wherein $n_{SiO2}$ is refractive index of the $SiO_2$ layer. The $SiO_2$ layer may be deposited by any known deposition method, for example, Chemical Vapor Deposition.

1.2 Exposing and Developing Photoresist

Figure 3:
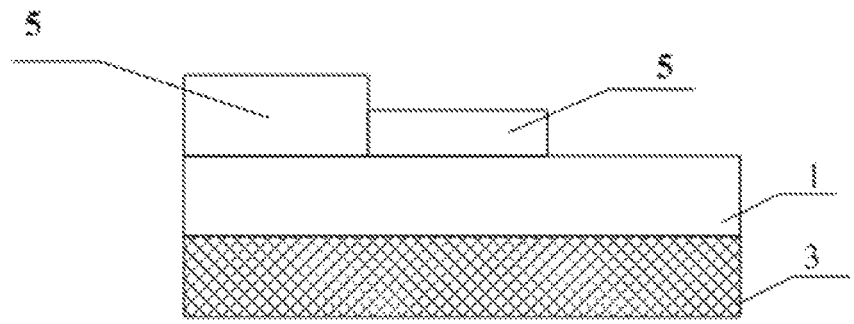
FIG. 3 is a schematic diagram showing a cross section after exposing and developing, in the preparing process Of the display Substrate in the embodiment of the invention.

As shown in FIG. 3, positive photoresist 5 is applied with a thickness of 2.0 μm on the $SiO_2$ layer by spinning. The photoresist 5 applied by spinning is exposed by using a prepared mask. Light exposure is controlled in regions corresponding to display units of different colors such that the thickness of the photoresist 5 is different in respective regions after developing. For example, it is assumed that the display units have three colors of red (R), green (G) and blue (B). Light exposures in regions corresponding to the display units of the three colors are controlled such that, when the regions are developed, photoresist 5 in region corresponding to display units of R color is not removed, photoresist 5 in region corresponding to display units of G color is partially removed, and photoresist 5 in region corresponding to display units of B color is completely removed. In this way, a pattern of photoresist with different thicknesses in different regions which corresponds respectively to the display units of R, and B colors as shown in FIG. 3 is obtained.

1.3 Etching Photoresist

Figure 4:
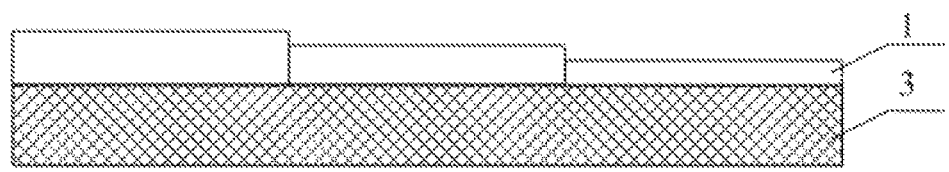
FIG. 4 is a schematic diagram showing a cross section after plasma etching, in the preparing process of the display substrate in the embodiment of the invention.

As shown in FIG. 4, the above-mentioned $SiO_2$ layer, which is formed as a plurality of patterns of photoresist having different thicknesses in different regions which correspond respectively to the display units of R, G, and B colors, is etched by plasma etching process. Etching speed is controlled with respect to respective regions so as to obtain an etching result capable of satisfying the following three conditions simultaneously:

photoresist 5 in region corresponding to display units of R color is completely removed, and the $SiO_2$ layer is substantially not etched;

photoresist 5 in region corresponding to display units of G color is completely removed, and the $SiO_2$ layer is etched such that thickness of remaining $SiO_2$ layer is $1/4n_{SiO2}$ of wavelength of green light, wherein $n_{SiO2}$ is refractive index of the $SiO_2$ layer; and photoresist 5 in region corresponding to display units of B color is completely removed, and the $SiO_2$ layer is etched such that thickness of remaining $SiO_2$ layer is $1/4n_{SiO2}$ of wavelength of blue light, wherein $n_{SiO2}$ is refractive index of the $SiO_2$ layer.

Thereby, patterns of first structural layer 1 forming a stairs-like shape as shown in FIG. 4 are obtained.

2) Forming a Second Structural Layer 2

Figure 5:
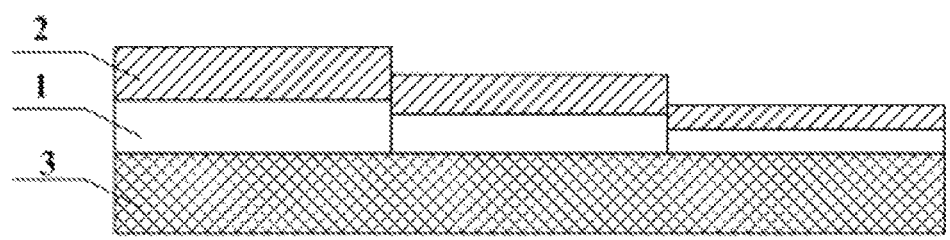
FIG. 5 is a schematic diagram showing a cross section after finishing a second structural layer, in the preparing process of the display substrate in the embodiment of the invention.

The second structural layer 2 is fabricated on the first structural layer 1 formed by the above manner. The steps for fabricating the second structural layer 2 are substantially the same as those for fabricating the first structural layer 1. The only difference between them is that, the second structural layer 2 is formed by using material with high refractive index, for example, $SiN_x$ or $TiO_2$. Patterns of second structural layer obtained are as shown in FIG. 5.

3) Forming a Bragg Reflection Structure

The first structural layer 1 and the second structural layer 2 are alternately and repeatedly formed so as to form the bragg reflection structure as shown in FIG. 1. Preferably, in the structure of alternately stacked first structural layer 1 and second structural layer 2, there may he multiple first structural layers 1 and multiple second structural layers 2. Such structure can enhance luminance of the emitting light.

4) Forming the Display Substrate

The bragg reflection structure prepared as above is aligned with a substrate, on which the display units 6 are disposed, so as to form a cell, wherein the display units 6 of different colors are disposed respectively opposite to the bragg reflection units 7 in corresponding regions, so that the display substrate is formed.

It will be understood that the foregoing embodiments are merely exemplary embodiments used for describing the principle of the present invention. However, the present invention is not limited to this. A person having ordinary skill in the relevant art may also make various modifications and variations without departing from the spirit and scope of the present invention, so these modifications and variations shall fall into the protection scope of the present invention.

The invention claimed is:

1. A display substrate, comprising display units of at least two different colors, characterized in that, a first display unit of the display units corresponds to one of the at least two different colors, a second display unit of the display units corresponds to the other one of the at least two different colors and the first display unit is different from the second display unit, the display substrate further comprises bragg reflection units located in different regions corresponding to respective display units, each of the bragg reflection units comprises a first structural layer and a second structural layer which are alternately stacked with each other and have different refractive indexes, and each of the bragg reflection units is configured according to the color of a corresponding display unit so that a bragg reflection unit corresponding to the first display units and a bragg reflection unit corresponding to the second display unit have different thicknesses, wherein, in each bragg reflection unit, thickness of the first structural layer is $1/4n_1$ of wavelength of incident light having the color of the corresponding display unit, wherein $n_1$ is refractive index of the first structural layer; and thickness of the second structural layer is $1/4n_2$ of wavelength of incident light having the color of the corresponding display unit, wherein $n_2$ is refractive index of the second structural layer.

2. The display substrate of claim 1, wherein the refractive index of the first structural layer is smaller than that of the second structural layer, and the incident light enters into the bragg reflection unit from the second structure layer.

3. The display substrate of claim 2, wherein each bragg reflection unit comprises at least two first structural layers and two second structural layers.

4. The display substrate of claim 3, wherein the display units include three types of display units, each type of which has a color selected from three primary colors.

5. The display substrate of claim 3, wherein the display units each comprise an organic light-emitting device emitting corresponding color light, and the bragg reflection units are disposed nearer to light-emitting side of the display substrate than the organic light-emitting devices.

6. The display substrate of claim 3, wherein the display units each comprise a color filter of corresponding color, and the bragg reflection units are disposed nearer to light-emitting side of the display substrate than the color filters.

7. The display substrate of claim 2, wherein material of the first structural layer is $SiO_2$.

8. The display substrate of claim 2, wherein material of the second structural layer is $SiN_x$ or $TiO_2$.

9. The display substrate of claim 2, wherein the display units include three types of display units, each type of which has a color selected from three primary colors.

10. The display substrate of claim 2, wherein the display units each comprise an organic light-emitting device emitting corresponding color light, and the bragg reflection units are disposed nearer to light-emitting side of the display substrate than the organic light-emitting devices.

11. The display substrate of claim 2, wherein the display units each comprise a color filter of corresponding color, and the bragg reflection units are disposed nearer to light-emitting side of the display substrate than the color filters.

12. The display substrate of claim 1, wherein each bragg reflection unit comprises at least two first structural layers and two second structural layers.

13. The display substrate of claim 1, wherein material of the second structural layer is $SiN_x$ or $TiO_2$.

14. The display substrate of claim 1, wherein the display units include three types of display units, each type of which has a color selected from three primary colors.

15. The display substrate of claim 14, wherein the three primary colors are red, green and blue.

16. The display substrate of claim 1, wherein the display units each comprise an organic light-emitting device emitting corresponding color light, and the bragg reflection units are disposed nearer to light-emitting side of the display substrate than the organic light-emitting devices.

17. The display substrate of claim 1, wherein the display units each comprise a color filter of corresponding color, and the bragg reflection units are disposed nearer to light-emitting side of the display substrate than the color filters.

* * * * *